United States Patent
Yang et al.

(10) Patent No.: US 8,245,104 B2
(45) Date of Patent: Aug. 14, 2012

(54) SYSTEMS AND METHODS FOR QUEUE BASED DATA DETECTION AND DECODING

(75) Inventors: Shaohua Yang, Santa Clara, CA (US); Hao Zhong, San Jose, CA (US); Weijun Tan, Longmont, CO (US); Richard Rauschmayer, Longmont, CO (US); Yuan Xing Lee, San Jose, CA (US)

(73) Assignee: LSI Corporation, Milpitas ( * ) Notice: Subject to any disclaimer, the term of this patent is extended or adjusted under 35 U.S.C. 154(b) by 1089 days.

(21) Appl. No.: 12/114,462

(22) Filed: May 2, 2008

(65) Prior Publication Data
US 2009/0273492 A1    Nov. 5, 2009

(51) Int. Cl.
*H03M 13/00* (2006.01)
(52) U.S. Cl. ........................................ 714/758
(58) Field of Classification Search ............... 714/799, 714/702, 795, 758, 755, 801, 756, 752; 375/262, 375/341
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,513,192 A | 4/1996 | Janku et al. | |
| 5,612,964 A | 3/1997 | Haraszti | |
| 5,642,365 A * | 6/1997 | Murakami et al. | 714/761 |
| 5,666,513 A * | 9/1997 | Whittaker | 711/118 |
| 5,701,314 A | 12/1997 | Armstrong et al. | |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,097,764 A | 8/2000 | McCallister et al. | |
| 6,216,251 B1 | 4/2001 | McGinn | |

(Continued)

FOREIGN PATENT DOCUMENTS
JP    2004164767    6/2004

(Continued)

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Phung M Chung
(74) *Attorney, Agent, or Firm* — Hamilton, DeSanctis & Cha

(57) ABSTRACT

Various embodiments of the present invention provide systems and methods for data processing. For example, a variable iteration data processing system is disclosed that includes at least a first detector, a second detector, a decoder, and a queuing buffer. The first detector is operable to perform a data detection on an input data set at a first time. The decoder receives a derivation of an output from the first detector and performs a decoding process. Where the decoding process fails to converge, the decoder output is passed to the second detector for a subsequent detection and decoding process at a second time.

20 Claims, 7 Drawing Sheets

U.S. PATENT DOCUMENTS

| | | |
|---|---|---|
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,788,654 B1 | 9/2004 | Hashimoto et al. |
| 6,810,502 B2 | 10/2004 | Eidson et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,093,179 B2 | 8/2006 | Shea |
| 7,184,486 B1 | 2/2007 | Wu et al. |
| 7,191,378 B2 | 3/2007 | Eroz et al. |
| 7,203,887 B2 | 4/2007 | Eroz et al. |
| 7,257,764 B2 | 8/2007 | Suzuki et al. |
| 7,310,768 B2 | 12/2007 | Eidson et al. |
| 7,646,829 B2 * | 1/2010 | Ashley et al. ............ 375/340 |
| 7,861,131 B1 * | 12/2010 | Xu et al. ............ 714/752 |
| 2001/0017904 A1 | 8/2001 | Pukkila et al. |
| 2004/0098659 A1 | 5/2004 | Bjerke et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0248435 A1 | 11/2006 | Haratsch |
| 2006/0265634 A1 | 11/2006 | Silvus et al. |
| 2007/0011569 A1 | 1/2007 | Casado et al. |
| 2007/0047635 A1 | 3/2007 | Stojanovic et al. |
| 2007/0286270 A1 | 12/2007 | Huang et al. |
| 2008/0049825 A1 | 2/2008 | Chen et al. |
| 2008/0168330 A1 | 7/2008 | Graef et al. |
| 2009/0132893 A1 | 5/2009 | Miyazaki et al. |
| 2009/0276689 A1 * | 11/2009 | Tan et al. ............ 714/799 |
| 2010/0070837 A1 * | 3/2010 | Xu et al. ............ 714/799 |
| 2010/0275096 A1 * | 10/2010 | Zhong et al. ............ 714/758 |
| 2010/0322048 A1 * | 12/2010 | Yang et al. ............ 369/47.15 |

FOREIGN PATENT DOCUMENTS

| | | |
|---|---|---|
| WO | WO 2006/016751 | 2/2006 |
| WO | WO 2006/091797 | 8/2007 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. on Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

Wu, et al. "Equation Based LDPC Decoder for Intersymbol INterference Channels" 2005 IEEE International Conf. on Acoustics, Speech, and Signal Processing vol. 5 Mar. 2005, pp . V-57-V-760.

* cited by examiner

US 8,245,104 B2

SYSTEMS AND METHODS FOR QUEUE BASED DATA DETECTION AND DECODING

BACKGROUND OF THE INVENTION

The present inventions are related to systems and methods for detecting and/or decoding information, and more particularly to systems and methods for performing iterative data decoding and/or detection.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any losses in data caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

To heighten the possibility of convergence, various existing processes utilize two or more detection and decode iterations. Turning to FIG. 1, an exemplary prior art two stage data detection and decode circuit 100 is depicted. Two stage data detection and decode circuit 100 receives a data input 105 that is applied to a detector 110. A hard and soft output from detector 110 is provided to an LDPC decoder 115. Input 105 is fed forward via a buffer 130 to another detector 120. Detector 120 uses a soft output of LDPC decider 115 and input 105 to perform an additional data detection process. A hard and soft output from detector 120 is provided to an LDPC decoder 125 that performs a second decoding process and provides an output 135. Where the initial detection and decode provided by detector 110 and LDPC decoder 115 does not converge, the subsequent detection and decode provided by detector 120 and LDPC decoder 125 provide an additional opportunity to converge. Such an approach, however, requires two iterations for each input data set introduced as input 105. This may waste significant power and introduce unnecessary latency where the input is capable of converging in a single iteration. Further, in some cases two iterations is insufficient to result in a convergence. Thus, such an approach is both wasteful in some conditions and insufficient in other conditions.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing iterative data decoding and/or detection.

Some embodiments of the present invention provide variable iteration data processing systems. Such systems include at least a first detector, a second detector, a decoder, and a queuing buffer. The first detector is operable to perform a data detection on an input data set at a first time. The decoder receives a derivation of an output from the first detector and performs a decoding process. Where the decoding process fails to converge, the decoder output is passed to the second detector for a subsequent detection and decoding process at a second time. In some cases, the output of the decoder includes both a hard output and a soft output. In such cases, the soft output is provided to the second detector via the queuing buffer. In particular instances, the output of the second detector is further passed to the decoder for yet another decoding attempt.

Various instances of the aforementioned embodiments include an output data buffer that stores the hard output whenever the output of the decoder converges. In such cases, the output data buffer is operable to re-order a series of decoder outputs that are received out of order. Some instances of the aforementioned embodiments include an input data buffer that stores the input data set for at least a period corresponding to the difference between the second time and the first time. In such cases, the input data set is provided to the second detector from the input data buffer. In particular instances, the output data buffer size determines the maximal period of time the input data set can be processed by the detector and decoder. Once the input data set reaches the maximal allowed time in the system, the corresponding output data is written into the output data buffer after the decoder has processed the data set without respect to whether the decoding has converged.

In some instances of the aforementioned embodiments, the systems further include an interleaver that interleaves the output from the first detector and provides the result as the derivation of the output from the first detector. The interleaver may further interleave the output from the second detector and provide the result as the derivation of the output from the second detector. The aforementioned systems may be incorporated into a number of different types of devices including, but not limited to, a storage device or a communication device.

Other embodiments of the present invention provide methods for processing a data input. Such methods include providing a first detector and a second detector. A data detection is performed on an input data set using the first detector where a detected data set is generated. The methods further include interleaving the detected data set where an interleaved data set is generated, and decoding the interleaved data set where a decoded data set is generated. It is determined whether the decoded data set converged. Where the decoded data set failed to converge, the decoded data set is provided for subsequent processing using the second detector. In some cases, the aforementioned is limited to situations where the maximal decoding latency is not reached and the queue buffer for holding decoded data set is not full. In some instances of the aforementioned embodiments, providing the decoded data set for subsequent processing using the second detector includes writing the decoded data set to a queuing buffer, and de-interleaving the decoded data set. When the queuing buffer is full, the system outputs a prior decoded data set even though the prior decoded failed to converge. In some cases, the prior decoded data set was processed through the decoder at least two times. In some cases, this may be limited to circumstances where the data set does not converge on a first decoding attempt.

In some instances of the aforementioned embodiments, the methods further include determining whether a prior decoded data set converged. Where it is determined that the prior decoded data set converged, the prior decoded data set is provided to an output buffer. In some cases, the output data buffer is operable to order the prior decoded data set relative to other decoded data sets. In particular instances of the aforementioned embodiments of the present invention, the data detection is a first data detection and the detected data set is a first detected data set. In such instances, the methods further include storing the input data set, de-interleaving the decoded data set where a de-interleaved data set is generated, aligning the decoded data set with the stored input data set, and performing a second data detection on the stored input data set and the de-interleaved data set using the second detector.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for performing iterative data decoding and/or detection.

Various embodiments of the present invention provide compact hardware solutions for iterative decoding suitable for read channel, wireless transmission and other applications. In some cases, embodiments of the present invention provide an algorithm that can achieve data dependent multiple global iterations using two or more data detectors feeding at least one decoder. In such cases, the decoder may be a single decoder or two independent decoders, or a single decoder that operates at twice the rate required to process data from a single detector. In the single decoder system, the decoder provides an ability to time share decoding power between two ongoing detection and decoding processes within a single codeword time. Such embodiments provide an ability to handle "bad" codewords (i.e., codewords that do not converged after a single global iteration) as an exception by writing corresponding results to a queuing buffer and subsequently reprocessing the codeword using one or more subsequent global iterations. The results of a bad codeword are provided out of order when either the queuing buffer becomes too full to re-process the codeword again or when the codeword converges. The maximum number of global iterations for a bad codeword depends on how many codewords are bad among the subsequent codewords, queue memory size, and a decoding latency constraint. As the aforementioned embodiments of the present invention allow for reporting the results of codeword processing out of order, a downstream hard decision buffer may be used to reorder received results to an order representing their original order. In other cases, the out of order results are simply reported to a recipient device without re-ordering.

Figure 1:
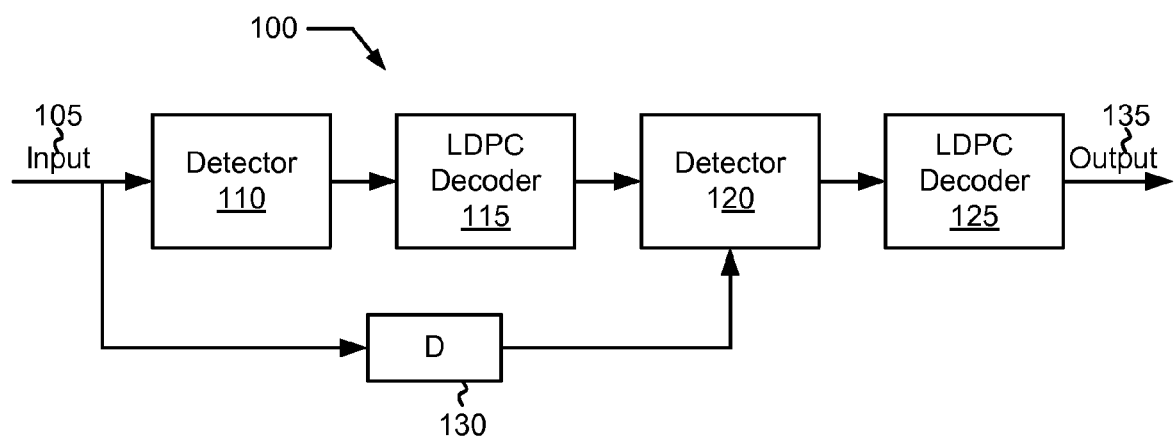
FIG. 1 depicts a prior art two stage data detection and decoding system.
Figure 2A:
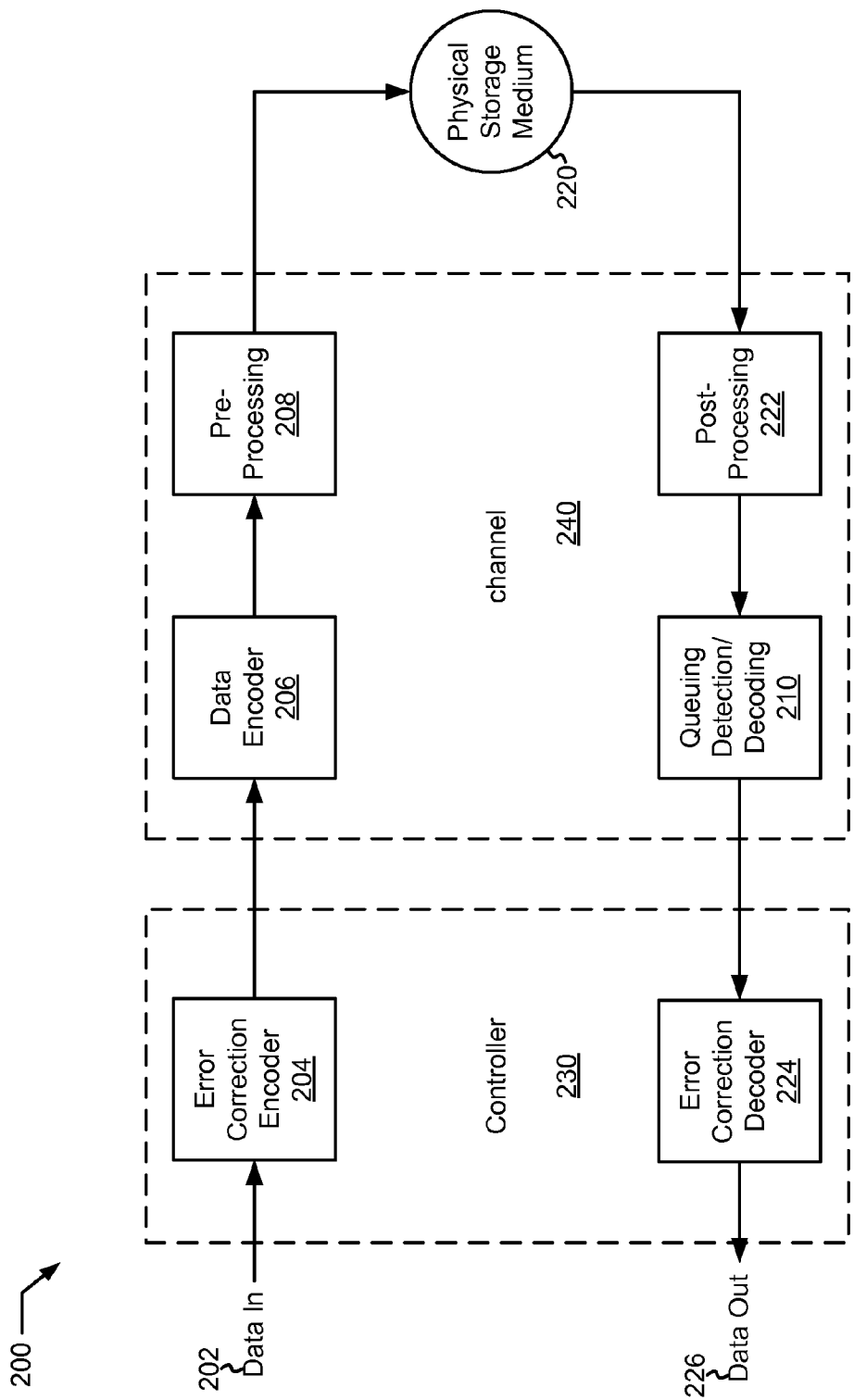
FIGS. 2a-2b depict data transfer systems using a queuing detection and decoding approach in accordance with some embodiments of the present invention.

Turning to FIG. 2a, a storage system 200 including a queuing detection/decoding circuit 210 is shown in accordance with some embodiments of the present invention. Storage system 200 includes a controller 230, a channel 240, and a physical storage medium 220. Physical storage medium 220 may be, but is not limited to, a magnetic disk. Based on the disclosure provided herein, one of ordinary skill in the art will recognize a variety of physical storage media that may be used in relation to different embodiments of the present invention. Controller 230 includes error correction encoding and decoding. In particular, controller 230 includes an error correction encoder 204. Error correction encoder 204 may be any error correction encoder known in the art including, but not limited to, a Reed Solomon encoder or a CRC encoder, and error correction decoder 224 may be, but is not limited to, a corresponding Reed Solomon decoder or CRC decoder. Both the aforementioned encoder and decoder may be any circuit or system known in the art that is capable of performing encoding and decoding processes. Channel 240 includes a data encoder 206 and a pre-processing circuit 208. In some cases, data encoder 206 is a Low Density Parity Check (LDPC) encoder. Based on the disclosure provided herein, one of ordinary skill in the art will recognize a variety of encoding processes and corresponding decoding processes that may be implemented in accordance with different embodiments of the present invention. Pre-processing circuit 208 includes the various pre-processing circuitry that is well known in the art. Post-processing circuit 222 includes the various post-processing circuitry that is well known in the art for receiving data from a physical storage medium and for preparing the received data for data detection and decoding.

In addition, channel 240 includes queuing detection/decoding circuit 210 that is capable of performing a variable number of detection and decoding iterations depending upon processing availability and/or convergence. Such a queuing detection/decoding circuit 210 allows for performing a variable number of iterations on a given input, while minimizing the number of iterations that must be performed. To perform this function, completion of input processing may be done out of order with the results reassembled at a later point.

In operation, a data input 202 is received. Data input 202 may be any data set destined for storage on physical storage medium 220. Data input 202 is encoded using error correction encoder 204 as is known in the art. The output of error correction encoder 204 is provided to data encoder 206 that may, for example, perform an LDPC encoding of the data. The output of data encoder 206 is provided to pre-processing circuit 208 that may convert the output from a digital output to an analog output satisfactory for writing to physical storage medium 220.

The data previously written to physical storage medium 220 may be subsequently retrieved and processed by post-processing circuit 222. In one case, post-processing circuit 222 performs an amplification of an analog data signal retrieved from physical storage medium 220, and converts the amplified analog signal to a digital signal that is output to queuing detection/decoding circuit 210. In turn, queuing detection/decoding circuit 210 performs a variable number of data detection and data decoding processes until either the output of the processes converges (i.e., it adequately represents the original data encoded by data encoder 206) or until insufficient resources remain to perform additional processing. Queuing detection/decoding circuit 210 provides its result as an output to error correction decoder 224. Error correction decoder 224 performs the designated error correction processing to determine whether any errors remain and if detected, attempts to correct the errors. Once the error correction processes are completed, error correction decoder 224 provides a data output 226. In general, data output 226 corresponds to data input 202 that was originally provided for writing to physical storage medium 220.

Figure 2B:
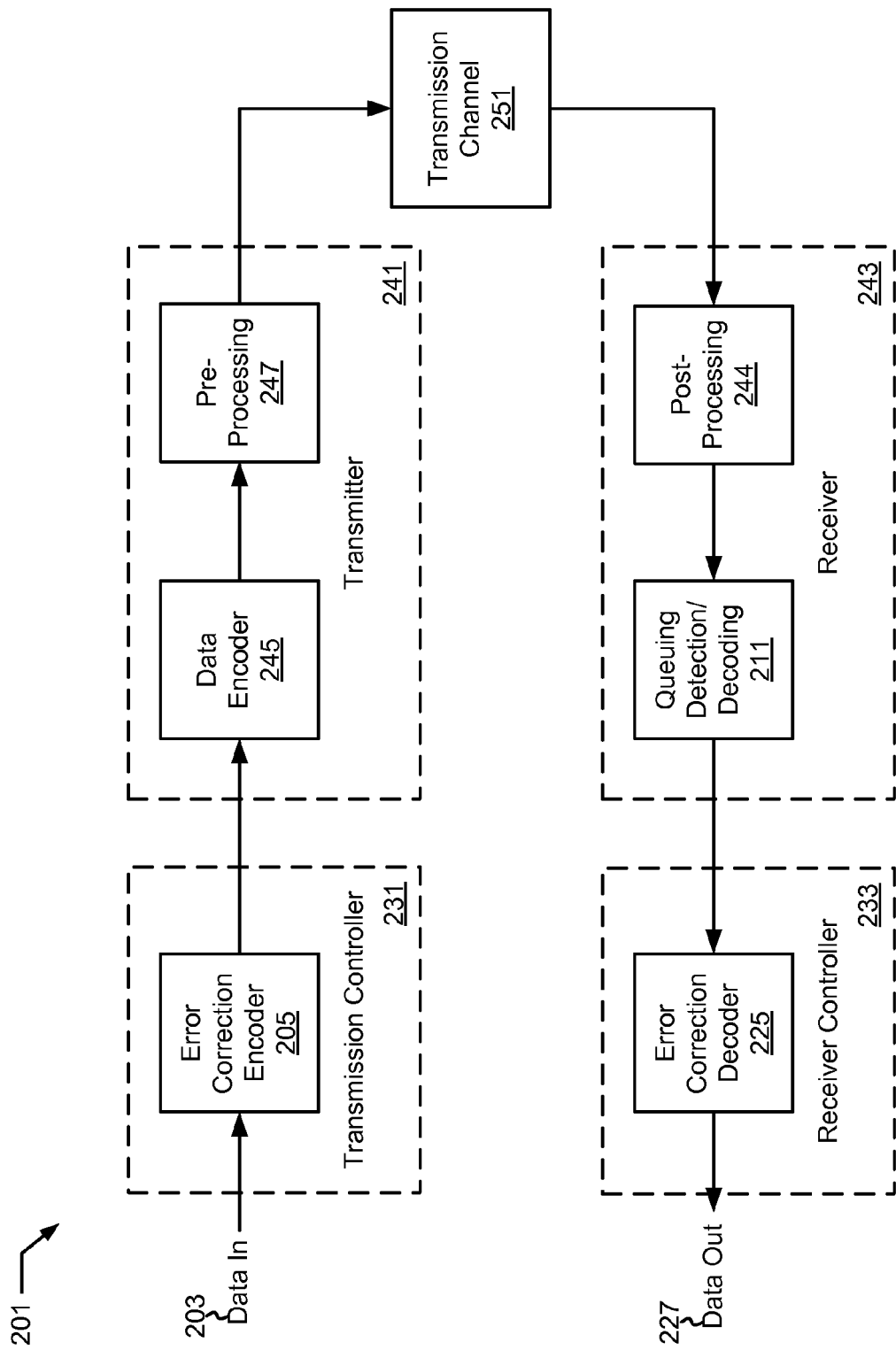

Turning to FIG. 2b, a transmission system 201 including a queuing detection/decoding circuit 211 is depicted in accordance with some embodiments of the present invention. Transmission system 201 includes a transmission controller 231, a transmitter 241, a transmission channel 251, a receiver 243, and a receiver controller 233. Transmission channel may be, but is not limited to, an RF transmission channel. Based on the disclosure provided herein, one of ordinary skill in the art will recognize a variety of transmission channels that may be used in relation to different embodiments of the present invention. Transmission controller 231 includes an error correction encoder that may be implemented, for example, as a Reed Solomon encoder or a CRC encoder. Similarly, receiver controller 233 includes an error correction decoder 225 corresponding to error correction encoder 205. Thus, error correction decoder 225 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 241 includes a data encoder 245 and a pre-processing circuit 247. In some cases, data encoder 245 is an LDPC encoder. Based on the disclosure provided herein, one of ordinary skill in the art will recognize a variety of encoding processes that may be implemented in accordance with different embodiments of the present invention. Pre-processing circuit 247 includes the various pre-processing circuitry that is well known in the art. In one particular case, pre-processing circuit 247 is operable to convert a digital data set from data encoder 245 to a corresponding RF signal suitable for transmission via transmission channel 251. The data set transferred via transmission channel 251 is received using a post-processing circuit 249 of receiver 243. Post-processing circuit 249 includes the various post-processing circuitry that is well known in the art for receiving data from a transmission channel and for preparing the received data for data detection and decoding.

In addition, receiver 243 includes queuing detection/decoding circuit 211 that is capable of performing a variable number of detection and decoding iterations depending upon processing availability and/or convergence. Such a queuing detection/decoding circuit 211 allows for performing a variable number of iterations on a given input, while minimizing the number of iterations that must be performed. To perform this function, completion of input processing may be done out of order with the results reassembled at a later point.

In operation, a data input 203 is received. Data input 203 may be any data set destined for transmission via transmission channel 231. Data input 203 is encoded using error correction encoder 205 as is known in the art. The output of error correction encoder 205 is provided to data encoder 245 that may, for example, perform an LDPC encoding of the data. The output of data encoder 245 is provided to pre-processing circuit 247 that may convert the output from a digital output to an analog output satisfactory for transmission via transmission channel 251.

The data transmitted via transmission channel 251 is received and processed by post-processing circuit 249 of receiver 243. In one case, post-processing circuit 249 performs an amplification of an analog data signal retrieved from transmission channel 251, and converts the amplified analog signal to a digital signal that is output to queuing detection/decoding circuit 211. In turn, queuing detection/decoding circuit 211 performs a variable number of data detection and data decoding processes until either the output of the processes converges (i.e., it adequately represents the original data encoded by data encoder 245) or until insufficient resources remain to perform additional processing. Queuing detection/decoding circuit 211 provides its result as an output to error correction decoder 225. Error correction decoder 225 performs the designated error correction processing to determine whether any errors remain and if detected, attempts to correct the errors. Once the error correction processes are completed, error correction decoder 225 provides a data output 227. In general, data output 227 corresponds to data input 203 that was originally provided for transmission via transmission channel 251.

It should be noted that while FIGS. 2a-2b depict a storage system and a transmission system to which a queuing detection/decoding circuit and/or process may be applied, that there are a variety of systems in which queuing detection/decoding circuits in accordance with different embodiments of the present invention may be applied. Based on the disclosure provided herein, one of ordinary skill in the art will recognize a variety of systems that may be benefited by use of a queuing detection/decoding circuit and/or process in accordance with different embodiments of the present invention.

Figure 3A:
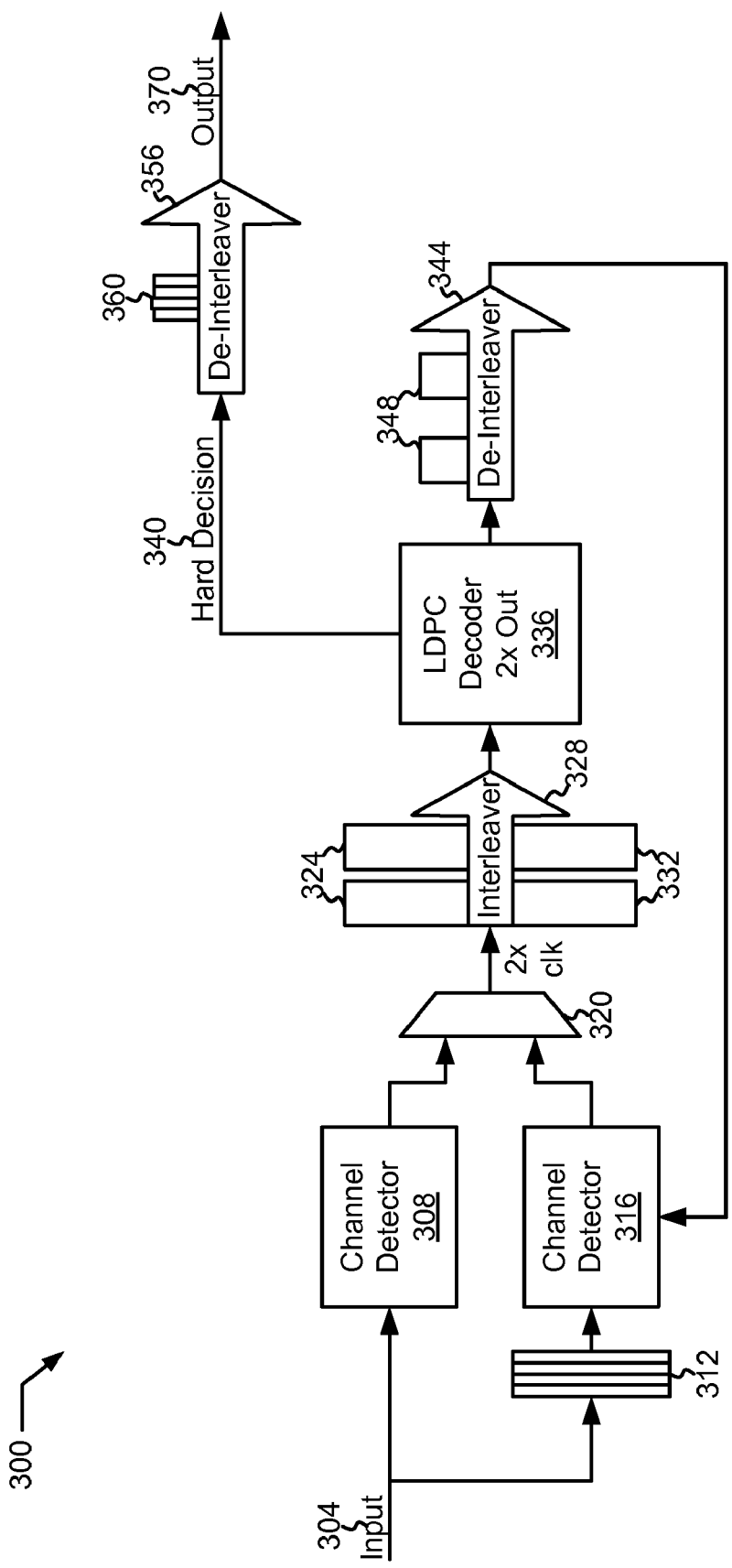
FIGS. 3a-3b depicts two different embodiments of queuing detection and decoding circuits in accordance with various embodiments of the present invention.

Turning to FIG. 3a, one implementation of a queuing detection/decoding circuit 300 is depicted in accordance with some embodiments of the present invention. Queuing detection/decoding circuit 300 includes a data input 304 that is fed to a channel detector 308. Channel detector 308 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 304 is provided to a input data buffer 312 that is designed to hold a number of data sets received from data input 304. The size of input data buffer 312 may be selected to provide sufficient buffering such that a data set input via data input 304 remains available at least until a first iteration processing of that same data set is complete and the processed data is available in a ping pong buffer 348 (i.e., a queuing buffer) as more fully described below. Input data buffer 312 provides the data sets to a channel detector 316. Similar to channel detector 308, channel detector 316 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 308 and channel detector 316 are provided to an interleaver circuit 328 via a multiplexer 320. Such outputs may be, for example, log likelihood ratio values. Interleaver circuit 320 interleaves the output of channel detector 308 and separately interleaves the output of channel detector 316 using two ping pong buffers 324, 332.

One of the buffers in ping pong buffer 324 holds the result of a prior interleaving process of the output from channel detector 308 and is unloaded to an LDPC decoder 336, while the other buffer of ping pong buffer 324 holds a data set from channel detector 308 that is currently being interleaved. Similarly, one of the buffers in ping pong buffer 332 holds the result of a prior interleaving process of the output from channel detector 316 and is unloaded to LDPC decoder 336, while the other buffer of ping pong buffer 324 holds a data set from channel detector 316 that is currently being interleaved.

LDPC decoder 336 is capable of decoding one or more data sets simultaneously. As an example, LDPC decoder 336 may be designed to decode an interleaved data set from ping pong buffer 324, or an interleaved data set from ping pong buffer 332, or to decode interleaved data sets from ping pong buffer 324 and ping pong buffer 332 simultaneously. The decoded data is either provided as a hard decision output 340 and/or to a de-interleaver circuit 344 that uses ping pong buffer 348 to de-interleave the decoded data and to provide the de-interleaved data as an input to channel detector 316. One of the buffers in ping pong buffer 348 holds the result of a prior de-interleaving process and is unloaded to channel detector 316, while the other buffer of ping pong buffer 348 holds a decoded data set currently being de-interleaved. Hard decision output 340 is provided to a de-interleaver circuit 356 that de-interleaves hard decision output 340 and stores the de-interleaved result in an output data buffer 360. Ultimately, de-interleaver circuit 356 provides the de-interleaved data stored in output data buffer 360 as an output 370.

In operation, a first data set is introduced via data input 304 to channel detector 308. Channel detector 308 performs its channel detection algorithm and provides both a hard output and a soft output to multiplexer 320. The hard and soft decision data is written to one buffer of ping pong buffer 324. At the same time the detector output is written into the buffer, interleaver 328 interleaves the data set by writing consecutive data into non-consecutive memory/buffer addresses based on the interleaver algorithm/mapping. Once interleaver 324 completes its interleaving process, the interleaved data is decoded by LDPC decoder 336. Where the data converges, LDPC decoder 336 writes its output as hard decision output 340 to output data buffer 360 and the processing is completed for that particular data set. Alternatively, where the data does not converge, LDPC decoder 336 writes its output (both soft and hard) to ping pong buffer 348. As more fully described below, the scheduling guarantees that there is at least one empty buffer for holding this new set of data, and this strategy assures that each data input is guaranteed the possibility of at least two global iterations (i.e., two passes through a detector and decoder pair).

The data written to ping pong buffer 348 is fed back to channel detector 316. Channel detector 316 selects the data set that corresponds to the output in ping pong buffer 348 from input data buffer 312 and performs a subsequent data detection aided by the soft output data generated by LDPC decoder 336 fed back from ping pong buffer 348. By using the previously generated soft data for data maintained in input data buffer 312, channel detector 316 generally performs a subsequent channel detection with heightened accuracy. The output of this subsequent channel detection is passed to interleaver 328 via multiplexer 320. The data is written to one buffer of ping pong buffer 332, and interleaver 328 interleaves the data. The interleaved data is then passed to LDPC decoder 336 where it is decoded a second time. Similar to the first iteration, a decision is made as to whether the data converged or whether there is insufficient space in ping pong buffer 348 to handle the data. Where such is the case, LDPC decoder 336 writes its output as hard decision output 340 to output data buffer 360 and the processing is complete for that particular data set. Alternatively, where the data does not converge and there is sufficient buffer space in ping pong buffer 348 to receive an additional data set, writes its output (both soft and hard) to ping pong buffer 348 where it is passed back to channel detector 316 for a third pass. Sufficient space is defined in ping pong buffer 348 by having at least reserved space for the data set from the first detector and decoder after the data set from the second detector and decoder is written into the ping pong buffer.

It should be noted that, as an example, a first data set may be applied at data input 304 and that it takes a number of iterations to converge while all subsequent data sets applied at data input 304 converge on the first pass (i.e., on a single iteration). In such a case, the first data set may be processed a number of times (i.e., a number of iterations) that is limited by the amount of memory available in output data buffer 360. Once output data buffer 360 is full or once an ordered set of outputs are available, the most recent hard decision output corresponding to the first data set is provided as a hard decision output and de-interleaver 356 re-orders the outputs putting the first output in the first position. With this done, output data buffer 360 are flushed out as output 370. In some embodiments of the present invention, de-interleaver 356 does not perform a re-ordering function and output data buffer 360 has a very limited size. In such a case, it is conceivable that a data set could be processed a very large number times (i.e., a large number of iterations) only limited by how long a recipient of output 370 is willing to wait for the data. As another example, it is possible that all data applied as data input 304 converges on its first pass. In such a case, channel detector 316, LDPC decoder 336 and/or de-interleaver 344 may be placed in a power saving mode to conserve power. As yet another example, it may be the case that all data sets applied at data input 304 fail to converge on the first pass (i.e., a single iteration). In such a case, all data sets would be iterated twice. It should also be noted that one or more additional channel detectors may be added along with additional space in ping pong buffers 324, 332, 248 that would facilitate more iterations in the situation where a significant number of closely located data sets fail to converge. In such cases, all data sets can be guaranteed to be decoded with number of iterations the same as the number of detectors.

Based on the disclosure provided herein, it will be appreciated that queuing detection/decoding circuit 300 allows for performance of a variable number of detection and decoding iterations depending upon the introduced data. Further, in some cases, considerable power savings may be achieved through use of queuing detection/decoding circuit 300. Yet further, in some cases, a faster LDPC decoder may be implemented allowing for an increased throughput where substantial first iteration data convergence exists as multiple iterations are not necessarily required. Yet further, by allowing results of LDPC decoder 336 to be reported out of order, upstream processing does not have to wait for the completion of downstream processing. Re-ordering of the out of order results may be done by queuing detection/decoding circuit 300 or by a downstream recipient of output 370.

Figure 3B:
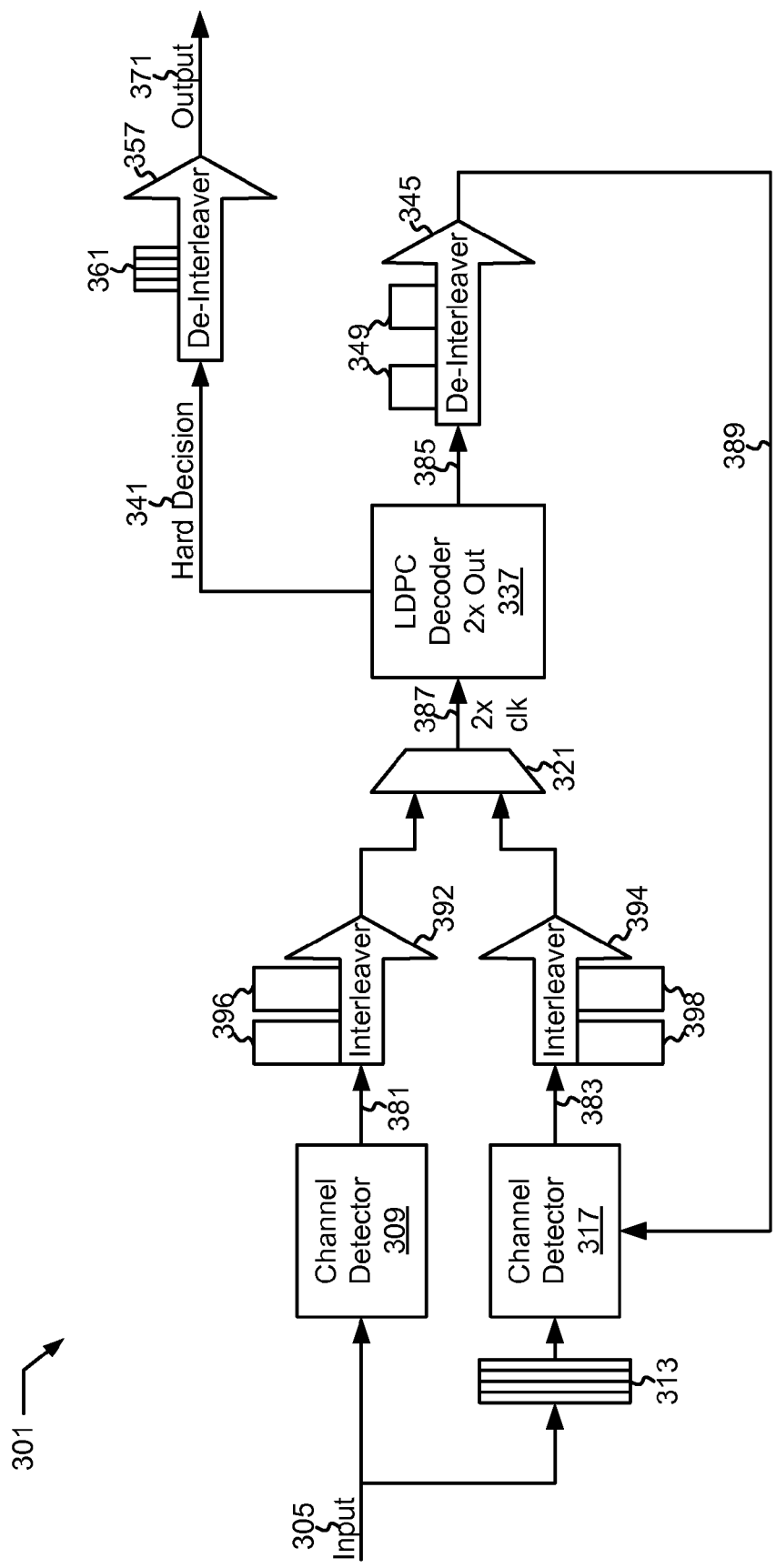

Turning to FIG. 3*b*, another implementation of a queuing detection/decoding circuit 301 is depicted in accordance with various other embodiments of the present invention. Queuing detection/decoding circuit 301 includes a data input 305 that is fed to a channel detector 309. Channel detector 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 305 is provided to a memory buffer 313 that is designed to hold a number of data sets received from data input 305. The size of memory buffer 313 may be selected to provide sufficient buffering such that a data set input via data input 305 remains available at least until a first iteration processing of that same data set is complete and the processed data is available in a ping pong buffer 349 as more fully described below. Memory buffer 313 provides the data sets to a channel detector 317. Similar to channel detector 309, channel detector 317 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of channel detector 309 is provided to an interleaver circuit 392, and the output of channel detector 317 is provided to another interleaver circuit 394. Interleaver circuit 392 interleaves the output of channel detector 309 using a ping pong buffer 396, and interleaver circuit 394 interleaves the output of channel detector 317 using a ping pong buffer 394. One of the buffers in ping pong buffer 396 holds the result of a prior interleaving process of the output from channel detector 309 and is unloaded to an LDPC decoder 337 via a multiplexer 321, while the other buffer of ping pong buffer 396 holds a data set from channel detector 309 that is currently being interleaved. Similarly, one of the buffers in ping pong buffer 398 holds the result of a prior interleaving process of the output from channel detector 317 and is unloaded to LDPC decoder 337 via a multiplexer 321, while the other buffer of ping pong buffer 398 holds a data set from channel detector 317 that is currently being interleaved.

LDPC decoder 337 is capable of decoding one or more data sets simultaneously. As an example, LDPC decoder 337 may be designed to decode an interleaved data set from ping pong buffer 396, to decode an interleaved data set from ping pong buffer 398, or to decode interleaved data sets from ping pong buffer 396 and ping pong buffer 398 simultaneously. The decoded data is either provided as a hard decision output 341 or to a de-interleaver circuit 345 that uses ping pong buffer 349 to de-interleave the decoded data and to provide the de-interleaved data as an input to channel detector 317. One of the buffers in ping pong buffer 349 holds the result of a prior de-interleaving process and is unloaded to channel detector 317, while the other buffer of ping pong buffer 349 holds a decoded data set currently being de-interleaved. Hard decision output 341 is provided to a de-interleaver circuit 357 that de-interleaves hard decision output 341 and stores the de-interleaved result in one of a number of memory buffers 361. Ultimately, de-interleaver circuit 357 provides the de-interleaved data stored in memory buffers 361 as an output 371.

Queuing detection/decoding circuit 301 operates similar to queuing detection/decoding circuit 300. Thus, queuing detection/decoding circuit 301 allows for performance of a variable number of detection and decoding iterations depending upon the introduced data. Further, in some cases, considerable power savings may be achieved through use of queuing detection/decoding circuit 301. Yet further, in some cases, a faster LDPC decoder may be implemented allowing for an increased throughput where substantial first iteration data convergence exists as multiple iterations are not necessarily required. Yet further, by allowing results of LDPC decoder 337 to be reported out of order, upstream processing does not have to wait for the completion of downstream processing. Re-ordering of the out of order results may be done by queuing detection/decoding circuit 301 or by a downstream recipient of output 371.

It should be noted that while two specific implementations of a queuing detection/decoding circuit are disclosed herein, it should be noted that a number of other variations are possible in accordance with different embodiments of the present invention. For example, separate decoders may be implemented with each corresponding to respective channel detectors. As yet another example, ping pong buffer 349 may be designed to include three or more data sets. One of the data set areas in buffer 349 is always reserved to hold the new data set coming from the first detector and first decoder, and the rests are used to hold data sets that have not converged decoding. Once the buffer 349 is full, the data set which has stayed in the buffer for the longest time needs to output from the decoder to the output buffer even though it does not converged after decoding. In some cases, the controller determines that the first detector can skip decoding a codeword. Based on the disclosure provided herein, one of ordinary skill in the art will recognize a variety of other modifications that may be possible in accordance with one or more embodiments of the present invention.

The circuits of FIGS. 3a-3b provide a queuing capability that allows for variable global iteration of multiple codewords where a global iteration includes a sequential detection and decoding process. The possibility of two global iterations is guaranteed, but not required. In the queuing systems supported by the circuits of FIGS. 3a-3b an input codeword may be initially processed using a Map4 detector and a subsequent LDPC decoder. If the codeword does not converge, its soft information may be stored into the LDPC soft output (i.e., queuing buffer) memory, and this queued codeword can then be processed in a subsequent global iteration by a second detector and the LDPC decoder until it either converges or must be passed on as an output due to latency constraints or lack of memory. The subsequent processing continues until at least one of the following conditions holds: the LDPC decoder successfully decodes the codeword (i.e., all parity checks are satisfied); the queue memory is full, and the earlier queued codeword has to give way to the new coming codeword; and/or the queued codeword has been in the system for more than a maximum latency time. The maximum latency time is determined by the size of a hard decision buffer (i.e., an output buffer) if such is utilized (measured in number of codewords). When used as a reordering buffer, the smallest meaningful size is sufficient to hold two codewords. A decoding failure occurs when a codeword is pushed out into the hard-decision buffer before the LDPC decoding converges.

Figure 4:
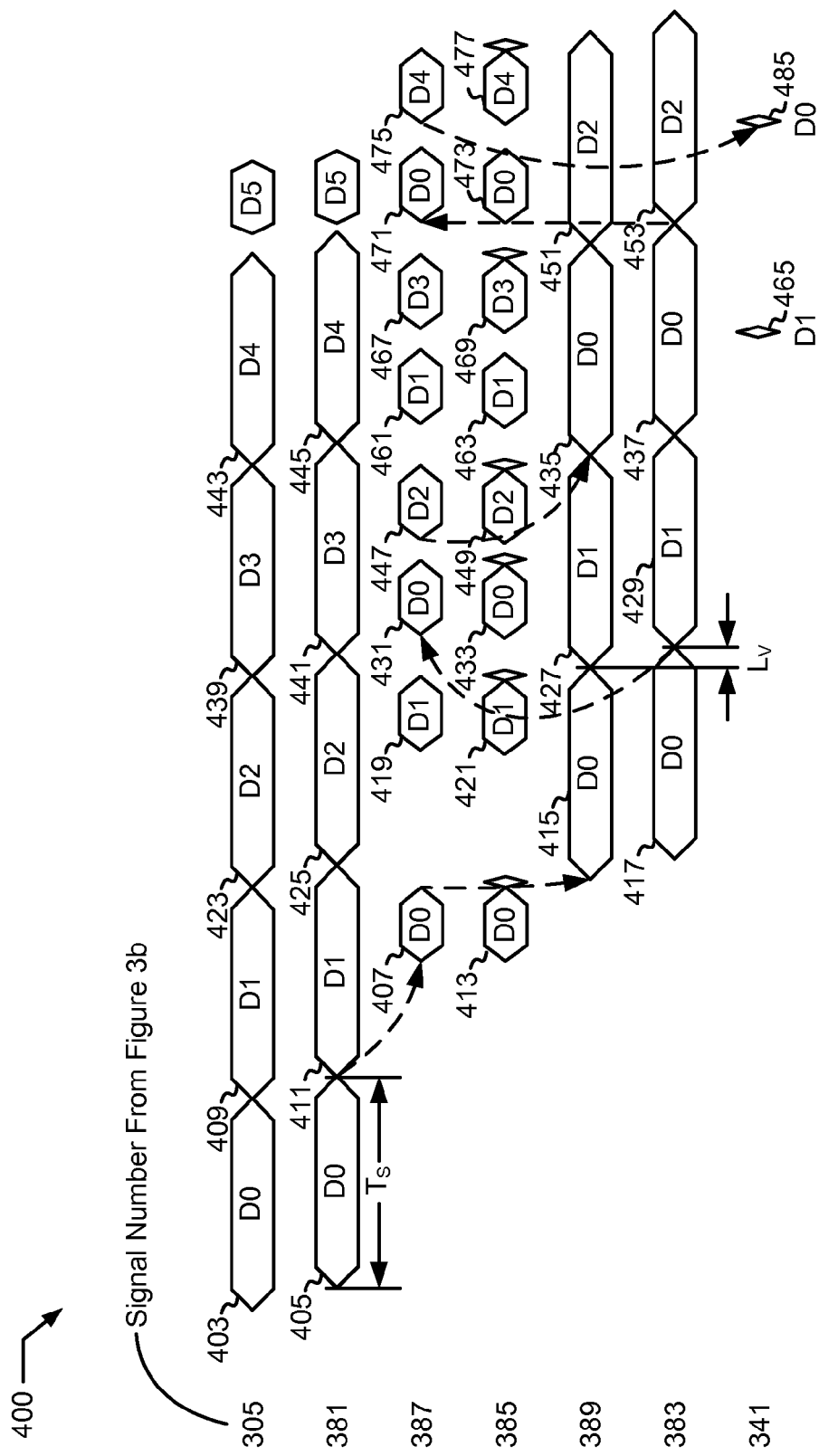
FIG. 4 is a timing diagram showing operation of a queuing detection and decoding circuit in accordance with one or more embodiments of the present invention.

Turning to FIG. 4, a timing diagram 400 showing an exemplary operation of queuing detection/decoding circuit 301 in accordance with one or more embodiments of the present invention applied specifically to implementation in a hard disk drive. A similar exemplary timing is achievable using queuing detection/decoding circuit 300, and for other system implementations. In this exemplary illustration, it is assumed that ping pong buffer 349 has space to hold three bad code words. Following timing diagram 400, a series of data bits are provided to channel detector 309 (designated 403). The received series of data bits is processed by channel detector 309 and the output is loaded into one buffer of ping pong buffer 396 (designated 405). Interleaver 397 unloads the aforementioned buffer to LDPC decoder 337 (designated 407), and LDPC decoder 337 provides the resulting decoded output (designated 413). At the same time, a subsequent series of data bits are provided to channel detector 309 (designated 409) and channel detector 309 processes the newly received series of bits into the other buffer of ping pong buffer 396 (designated 411). In this case, it is determined that the output of LDPC decoder 337 did not converge, and thus the output of LDPC decoder 337 is written to one buffer of ping pong buffer 349 that is made available as an input to channel detector 317 (designated 415). The data from ping pong buffer 349 (designated 415) is processed through channel detector 317 and its output is loaded into a buffer of ping pong buffer 398 (designated 417).

At the same time, interleaver 397 unloads ping pong buffer 396 to LDPC decoder 337 (designated 419), and LDPC decoder 337 provides the resulting decoded output (designated 421). Further, a subsequent series of data bits are provided to channel detector 309 (designated 40423) and channel detector 309 processes the newly received series of bits into the other buffer of ping pong buffer 396 (designated 425). Again, the output of LDPC decoder 337 fails to converge in this case, and thus the output of LDPC decoder 337 is written to one buffer of ping pong buffer 349 that is made available as an input to channel detector 317 (designated 427). The data from ping pong buffer 349 (designated 427) is processed through channel detector 317 and its output is loaded into a buffer of ping pong buffer 398 (designated 429). Data corresponding to the first data set (designated 403) is then pulled from ping pong buffer 398 and reprocessed through LDPC decoder 337 (designated 431, 433). In this case, LDPC decoder 337 still does not converge, and thus the output of LDPC decoder 337 is written to one buffer of ping pong buffer 349 that is made available as an input to channel detector 317 (designated 435). This data is then pulled from ping pong buffer 349 and processed again through channel detector 317 (designated 437).

At the same time, subsequent series of data are processed through channel detector 309 and presented to LDPC decoder 337 (designated 439, 441, 443, 445). These subsequent series of data are processed through LDPC decoder 337 and because the result does not converge the output is written to ping pong buffer 349 (designated 447, 449, 453). Data corresponding to the second data set (designated 409) is then pulled from ping pong buffer 398 and reprocessed through LDPC decoder 337 (designated 461, 463). In this case, LDPC decoder 337 converges and the output of LDPC decoder 337 is written as a hard decision output (designated 465). Data corresponding to the fourth data set (designated 439) is then pulled from ping pong buffer 396 and processed through LDPC decoder 337 (designated 467, 469). Subsequently, data corresponding to the first data set (designated 405) is then pulled from ping pong buffer 398 and reprocessed through LDPC decoder 337 (designated 471, 473). In this case, LDPC decoder 337 fails to converge again, but ping pong buffer 349 has to reserve one space for the incoming data set from ping pong memory 396 (designated by 475, 477) and thus the queue (ping pong) buffer 349 is considered to be full. Thus, the decoded codeword (designated by 471, 473) has to be designated as complete and reported as an output from the system. As such, the existing hard decision output corresponding to the first data set (designated 405) is written as a hard decision output (designated 485).

Of note, processing of the data corresponding to the first data set (designated 403) finished after that corresponding to the second data set (designated 409). Because of this ability to process data sets out of order, it is possible that each data set will be processed a number of iterations corresponding to its particular needs and the available memory capability. This is referred to as queuing capability and provides for a variety of processing advantages. It should be noted that the timing of timing diagram 400 is exemplary, and that a variety of different situations may be achieved depending on the particular data set presented.

Timing diagram designates the time period over which a data input is received as a sector time (Ts). Further, the time required to process through channel detector 317 is designated as Lv. The time that a codeword spends in a queue (e.g., filled into ping pong buffer 349, and wait for the second detector to be available from processing other queued code words) is designated as Q, and the number of iterations performed on a particular data input is designated as M. Based on these variables, the following decoding latency can be derived to be approximately:

$$(2M+Q-(M>1?0.5:0))*Ts+Lv.$$

In the timing above, the queuing detection/decoding circuit may not control when an incoming codeword will be introduced. The decoder sharing scheme may include budgeting a minimum of N1 local iterations for decoding a newly received codeword with N1 being a programmable value. The decoding time frame is aligned with the end of the next codeword time. The first half of codeword time (N2 local iterations) is budgeted for processing soft information from the second detector (i.e., working on a later global iteration of a previously processed codeword). If the codeword from the ping pong buffer awaiting a later global iteration converges before the start of a later global iteration begins (i.e., N2 local iterations), the decoder will immediately start decoding the new-coming codeword earlier than the predicted time to start. This results in >N1 local iterations for the new-coming codeword. In the extreme cases when there are no codewords queued for subsequent global iteration(s), the decoder starts processing soft information from a newly incoming codeword as it becomes available for processing. In this way, the decoder finishes processing no later than the ping pong buffer holding newly detected codewords fills as the detector now needs to switch to the current ping-pong memory.

In the case where there are multiple component encoded words interleaved to form a larger codeword, decoding interleaved component detected results is done one by one. In such a case, each decoded word would be provided with equal maximum decoding time. If a particular decoded word converges earlier than budgeted decoding time, the saved time may be used to decode the next decoded word. In this way, a "good" codeword (i.e., a codeword that converges after one global iteration) takes less time decoding than "bad" codeword (i.e., a codeword that demands two or more global iterations). Once the time allotted for decoding a decoded word is exhausted or the decoded word has converged, the extrinsic soft information from the decoder is written into the queue memory. This write process may be accomplished during the first local iteration of a subsequent codeword. If decoding converges, the hard decisions corresponding to the converged codeword is written into the hard decision buffer memory. Alternatively, where one or more of the codewords in the post decoder queue fail to converge, the codewords may possibly remain in the queue for additional global iterations until a maximal decoding delay is exceeded at which point the available result is reported as a hard decision output. In addition, one or more flags may be maintained indicating decoding convergence of the individual codewords so that the previously convereged codewords will not be launched into a subsequent global iteration. In some cases, a given codeword will always occupy the same memory slot within the queue until it is finally replaced by a subsequent codeword.

Where the post decoder queue has soft information for a full codeword and the ping pong memory associated with the later iteration detector has an open buffer in its ping pong memory, the later iteration detector starts processing the soft information stored in the leading queue memory, and also writes the detector soft information into the open buffer in the ping-pong memory. When the ping-pong memory is full, the decoder immediately starts processing the codeword in ping pong memory if the decoder has idle time for at least some local iterations on the queued codewords before the decoder has to start decoding a new codeword from ping pong memory associated with the first pass detector. If any codeword from the later iteration detector does not converge in the subsequent decoding process, the hard decisions are output if either the queue memory is full, or the latency of the particular codeword has exceeded a defined maximum. Alternatively, the soft information associated with the non-converging codeword is returned to its original location in the queue to await an additional global iteration.

Figure 5:
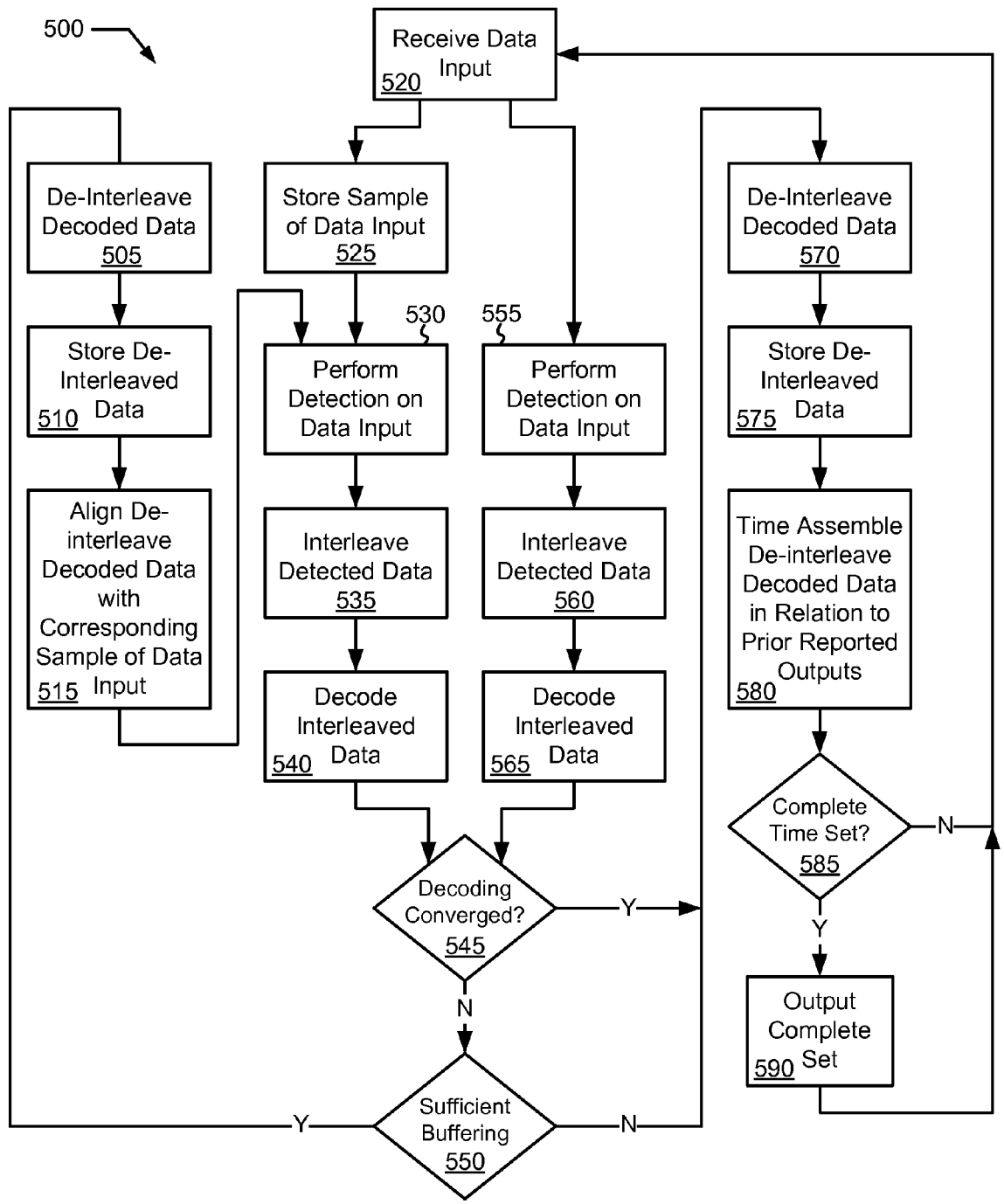
FIG. 5 is a flow diagram showing a method in accordance with some embodiments of the present invention for performing variable iterative detection and decoding processes.

Turning to FIG. 5, a timing diagram 500 depicts a method in accordance with some embodiments of the present invention for performing variable iterative detection and decoding processes. Following flow diagram 500, a data input is received (block 520). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 525). Data detection processes are performed on the received data (block 555), the detected data is interleaved (block 560), and the interleaved data is decoded (block 565). It is then determined whether the decoding process converged (block 545), and whether there is sufficient buffering available to reprocess the data (block 550).

Where either the decoding process converged (block 545) or there is insufficient buffering available (block 550), the decoded data is de-interleaved (block 570) and stored in a buffer (block 575). The buffer includes various results that may have become available out of order, and as such the various results are reordered in the buffer to represent the order in which the corresponding data input was originally received (block 580). It is then determined if a complete time set is available in the buffer (block 585). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 585) or where the results are to be reported as they are received without regard to order, the result(s) are output to a recipient (block 590).

Alternatively, where the decoding process failed to converge (block 545) and there is sufficient buffering available (block 550), the process of detection and decoding is repeated. In particular, the decoded data is de-interleaved (block 505) and the resulting de-interleaved data is stored to a buffer (block 510). Once the data detector is available, the de-interleaved data is aligned with the corresponding sample of the data input (block 515). The de-interleaved data and the corresponding sample data input is provided to the data detector where a subsequent data detection is performed (block 530) on the originally stored sample of data input (block 525) using the soft input developed in the earlier processing of the same data input (blocks 555, 560, 565, 545, 550, 505, 510, 515). The result of the data detection process is interleaved (block 535) and the interleaved data is decoded (block 540). At this point, it is determined whether the data detection and decoding process is to be repeated (blocks 505, 510, 515, 530, 535, 540) or whether the result is to be reported (blocks 570, 575, 580, 585, 590).

In conclusion, the invention provides novel systems, devices, methods and arrangements for performing iterative data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A variable iteration data processing system, the system comprising:
    a first detector, wherein the first detector is operable to perform a data detection on an input data set at a first time;
    a second detector;
    a decoder, wherein the decoder is operable to receive a derivation of an output from the first detector and a derivation of an output from the second detector;
    a queuing buffer, wherein the queuing buffer stores an output of the decoder corresponding to the input data set; and
    wherein the second detector is operable to perform a data detection on the input data set using the output of the decoder at a second time only if the output of the decoder failed to converge, and wherein the second time is subsequent to the first time.

2. The system of claim 1, wherein the output of the decoder includes both a hard output and a soft output, and wherein the soft output is provided to the second detector via the queuing buffer.

3. The system of claim 2, the system further comprising:
    an output data buffer, wherein the output data buffer stores the hard output whenever the output of the decoder converges.

4. The system of claim 3, wherein the input data set is a first input data set, wherein the decoder output is a first decoder output corresponding to the first input data set, wherein the decoder provides a second decoder output corresponding to a second input data set, and wherein the output data buffer is operable to order the first decoder output in relation to the second decoder output.

5. The system of claim 1, the system further comprising:
    an input data buffer, wherein the input data buffer stores the input data set for at least a period corresponding to the difference between the second time and the first time, and wherein the input data set is provided to the second detector from the input data buffer.

6. The system of claim 1, wherein the system further includes an interleaver, wherein the interleaver interleaves the output from the first detector and provides the result as the derivation of the output from the first detector.

7. The system of claim 6, wherein the interleaver further interleaves the output from the second detector and provides the result as the derivation of the output from the second detector.

8. The system of claim 1, wherein the input data set is a first input data set, wherein the first detector is operable to perform a data detection on a second input data set at a third time, wherein the decoder is operable to receive a derivation of the output from the first detector corresponding to the second input data set, and wherein the queuing buffer is operable to overwrite the output of the decoder corresponding to the first input data set with an output of the decoder corresponding to the second input data set.

9. The system of claim 8, wherein the output of the decoder corresponding to the first input data set is written to an output data buffer even though the output of the decoder corresponding to the first input data set failed to converge.

10. The system of claim 8, wherein the second detector is operable to perform a data detection on the second input data set using the output of the decoder corresponding to the second input data set at a fourth time only if the output of the decoder failed to converge, and wherein the second time is subsequent to the first time.

11. The system of claim 1, wherein the system is incorporated in a device selected from a group consisting of: a storage device, and a communication device.

12. The system of claim 1, wherein the system is implemented as part of an integrated circuit.

13. A data processing circuit, the circuit comprising:
a first detector, wherein the first detector is operable to perform a data detection on a first input data set at a first time and on a second input data set at a second time;
a second detector;
a decoder, wherein the decoder is operable to receive a derivation of an output from the first detector corresponding to the first data set, an output from the first detector corresponding to the second data set, and a derivation of an output from the second detector;
wherein the second detector is operable to perform a data detection on the first input data set using the output of the decoder corresponding to the first input data set at a third time only if the output of the decoder failed to converge, and wherein the third time is subsequent to the first time and to the second time; and
an output data buffer, wherein the output data buffer receives the output of the decoder corresponding to the first input data set subsequent to receiving the output of the decoder corresponding to the second input data set, and wherein the output data buffer is operable to order the first decoder output in relation to the second decoder output.

14. The data processing circuit of claim 13, wherein the output of the decoder includes both a hard output and a soft output, and wherein the soft output is provided to the second detector via a queuing buffer.

15. The data processing circuit of claim 14, the circuit further comprising:
an output data buffer, wherein the output data buffer stores the hard output whenever the output of the decoder converges.

16. The data processing circuit of claim 15, wherein the input data set is a first input data set, wherein the decoder output is a first decoder output corresponding to the first input data set, wherein the decoder provides a second decoder output corresponding to a second input data set, and wherein the output data buffer is operable to order the first decoder output in relation to the second decoder output.

17. The data processing circuit of claim 13, the circuit further comprising:
an input data buffer, wherein the input data buffer stores the input data set for at least a period corresponding to the difference between the second time and the first time, and wherein the input data set is provided to the second detector from the input data buffer.

18. The data processing circuit of claim 13, wherein the input data set is a first input data set, wherein the first detector is operable to perform a data detection on a second input data set at a third time, wherein the decoder is operable to receive a derivation of the output from the first detector corresponding to the second input data set, and wherein the queuing buffer is operable to overwrite the output of the decoder corresponding to the first input data set with an output of the decoder corresponding to the second input data set.

19. The data processing circuit of claim 18, wherein the output of the decoder corresponding to the first input data set is written to an output data buffer even though the output of the decoder corresponding to the first input data set failed to converge.

20. The data processing circuit of claim 18, wherein the second detector is operable to perform a data detection on the second input data set using the output of the decoder corresponding to the second input data set at a fourth time only if the output of the decoder failed to converge, and wherein the second time is subsequent to the first time.

* * * * *